US012034408B2

(12) United States Patent
Chan et al.

(10) Patent No.: US 12,034,408 B2
(45) Date of Patent: Jul. 9, 2024

(54) WIDEBAND DOHERTY POWER AMPLIFIER

(71) Applicant: City University of Hong Kong, Hong Kong (HK)

(72) Inventors: Wing Shing Chan, Hong Kong (HK); Xinyu Zhou, Stanford, CA (US)

(73) Assignee: City University of Hong Kong, Hong Kong (HK)

( * ) Notice: Subject to any disclaimer, the term of this patent is extended or adjusted under 35 U.S.C. 154(b) by 421 days.

(21) Appl. No.: 17/524,756

(22) Filed: Nov. 12, 2021

(65) Prior Publication Data

US 2022/0158591 A1    May 19, 2022

Related U.S. Application Data

(60) Provisional application No. 63/113,993, filed on Nov. 16, 2020.

(51) Int. Cl.
| | | |
|---|---|---|
| *H03F 1/07* | (2006.01) | |
| *H03F 1/02* | (2006.01) | |
| *H03F 1/56* | (2006.01) | |
| *H03F 3/24* | (2006.01) | |
| *H03F 3/60* | (2006.01) | |

(52) U.S. Cl.
CPC ............ *H03F 1/0288* (2013.01); *H03F 1/56* (2013.01); *H03F 3/245* (2013.01); *H03F 3/602* (2013.01); *H03F 2200/255* (2013.01); *H03F 2200/318* (2013.01)

(58) Field of Classification Search
CPC .................................. H03F 1/07; H03F 1/0288
USPC .............................................. 330/124 R, 295
See application file for complete search history.

(56) References Cited

U.S. PATENT DOCUMENTS

| | | | |
|---|---|---|---|
| 10,320,335 B1 | 6/2019 | Jang et al. | |
| 10,355,647 B2 | 7/2019 | Datta et al. | |
| 10,483,918 B2 | 11/2019 | Jin et al. | |

(Continued)

FOREIGN PATENT DOCUMENTS

| | | |
|---|---|---|
| CN | 111010092 A | 4/2020 |
| CN | 111030620 A | 4/2020 |

(Continued)

*Primary Examiner* — Henry Choe
(74) *Attorney, Agent, or Firm* — Idea Intellectual Limited; Margaret A. Burke; Sam T. Yip

(57) ABSTRACT

The present invention provides a wideband Doherty power amplifier comprising: a main power amplification device; an auxiliary power amplification device arranged in parallel with the main power amplification device; and a coupled phase compensation network configured for compensating a phase shift between the main power amplification device and the auxiliary power amplification device. The phase compensation network comprising a first transmission line section; a second transmission line section extending substantially collinearly with the first transmission line section; and two pairs of end-connected coupled transmission lines connected in parallel between the first transmission line section and the second transmission line section. The provided Doherty power amplifier demonstrated operation at 6 dB back-off between 1.3-2.3 GHz with efficiency in excess of 41%, which can be used in modern and future wireless communication systems which require power amplifiers operating over a wide frequency range.

18 Claims, 14 Drawing Sheets

(56) References Cited

U.S. PATENT DOCUMENTS

| | | | |
|---|---|---|---|
| 10,491,165 B2 | 11/2019 | Gaynor | |
| 10,511,265 B2 | 12/2019 | Al et al. | |
| 10,541,653 B2 * | 1/2020 | Zhu | H03F 1/565 |
| 10,601,375 B2 | 3/2020 | Grebennikov et al. | |
| 10,608,594 B2 | 3/2020 | Komatsuzaki et al. | |
| 10,630,242 B2 | 4/2020 | McLaren | |
| 10,686,408 B2 | 6/2020 | Jiang | |
| 10,833,634 B2 * | 11/2020 | Chan | H03F 1/0288 |
| 11,043,920 B2 * | 6/2021 | Chan | H03F 3/211 |

FOREIGN PATENT DOCUMENTS

| | | |
|---|---|---|
| CN | 111181509 A | 5/2020 |
| CN | 210490802 U | 5/2020 |
| CN | 111384901 A | 7/2020 |

\* cited by examiner

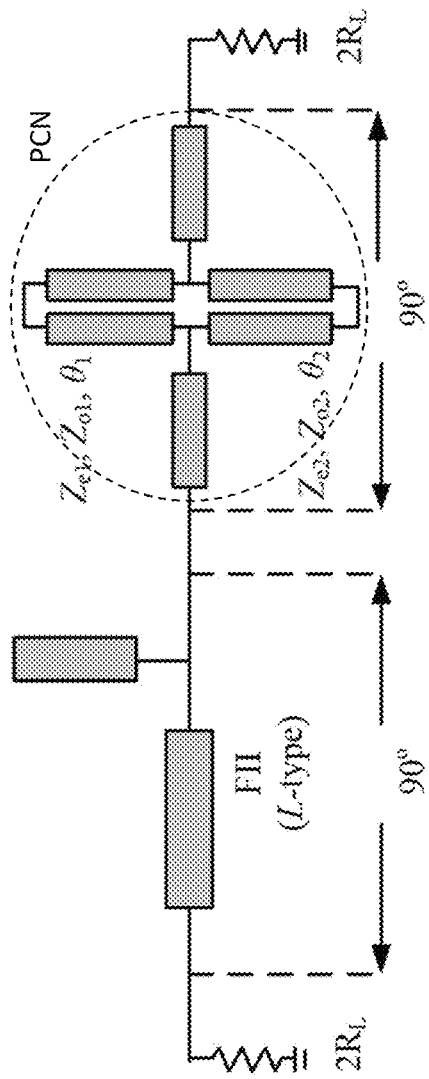
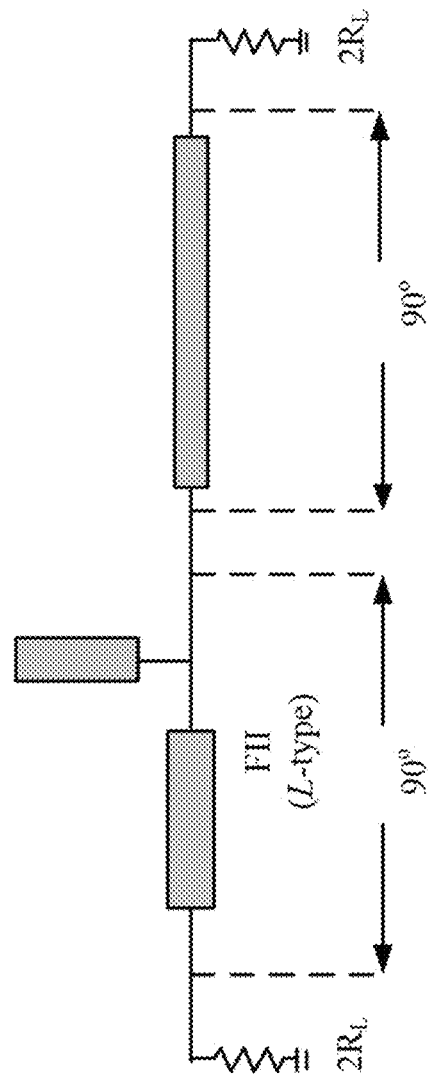
FIG. 5A
FIG. 5B

WIDEBAND DOHERTY POWER AMPLIFIER

CROSS-REFERENCE TO RELATED APPLICATIONS

This application is claims priority to U.S. Provisional Patent Application No. 63/113,993, filed on Nov. 16, 2020, the disclosure of which is incorporated by reference herein in their entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a Doherty power amplifier, and particularly, although not exclusively, to a Doherty power amplifier based on a coupled phase compensation network.

BACKGROUND OF THE INVENTION

Doherty power amplifier (DPA) is widely adopted in modern wireless communication systems as it typically provides high efficiency from 6-dB output power back-off to saturation. Due to the output current generated by the peaking device at the back-off point, the carrier device load impedance can be modulated, thereby achieving an additional efficiency peak. This unique characteristic of the DPA is particularly suitable for modern and emerging communication standards that typically uses modulated signal with high peak to average power ratios (PAPRs). However, the biggest problem with conventional DPA topologies is the narrow bandwidth, which limits its usage. In recent years, bandwidth extension of DPAs have therefore attracted a lot of interest in both academia and industry. The post-matching Doherty power amplifier (PM-DPA), as a solution to broad bandwidth, in general have 40% bandwidth. However, further improvement has been difficult, due mainly to two reasons. Firstly, the peaking branch (peaking fundamental impedance inverter (FII) plus phase compensation network (PCN)) suffers from a large impedance transformation ratio at saturation. This restricts the peaking amplifier bandwidth, thus limiting the load modulation bandwidth. Secondly, conventional FIIs used in DPAs, often have complicated topologies that can introduce large phase delays. Together with phase delay variations over a wide frequency range that limits performance for wideband operation.

SUMMARY OF THE INVENTION

According to one aspect of the present invention, a wideband Doherty power amplifier (DPA) is provided. The wideband DPA comprises: a main power amplification device; an auxiliary power amplification device arranged in parallel with the main power amplification device; a first fundamental impedance inverter having an input connected to an output of the main power amplification device through a first DC block; a second fundamental impedance inverter having an input connected to an output of the auxiliary power amplification device through a second DC block; a coupled phase compensation network connected across respective outputs of the first and second fundamental impedance inverters and configured for compensating a phase shift between the main power amplification device and the auxiliary power amplification device. The coupled phase compensation network comprises: a first transmission line section connected with the first fundamental impedance inverter; a second transmission line section connected with the second fundamental impedance inverter; and two pairs of end-connected coupled transmission lines connected in parallel between the first transmission line section and the second transmission line section.

By using the coupled phase compensation network instead of the conventional quarter-wavelength transmission line, the external Q-factor (QE) of the entire peaking branch is reduced. Consequently, the drain termination impedance trajectory of the peaking device is distributed around its optimal value. Hence, a good efficiency/output power performance of the peaking amplifier can be obtained over a significantly wider frequency range and the bandwidth of the DPA can be extended. Measured results of the provided Doherty power amplifier demonstrated operation at 6 dB back-off between 1.3-2.3 GHz (55% fractional bandwidth) with efficiency in excess of 41%. The bandwidth-extended DPA provided by the invention can be used in modern and future wireless communication systems which require power amplifiers operating over a wide frequency range, such as 4G and 5G mobile radio communication systems. The electrical power cost to operate base station power amplifiers will also be reduced significantly for future wireless communication systems.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the invention are described in more detail hereinafter with reference to the drawings, in which:

FIG. 5A shows circuit geometry of an entire peaking branch including a L-type FII coupling with a phase compensation network (PCN) according to an embodiment of the invention;

FIG. 5B shows geometry of an entire peaking branch including a L-type FII coupling with a conventional PCN which is formed with a microstrip line;

DETAILED DESCRIPTION

In the following description, exemplary embodiments of the present invention are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
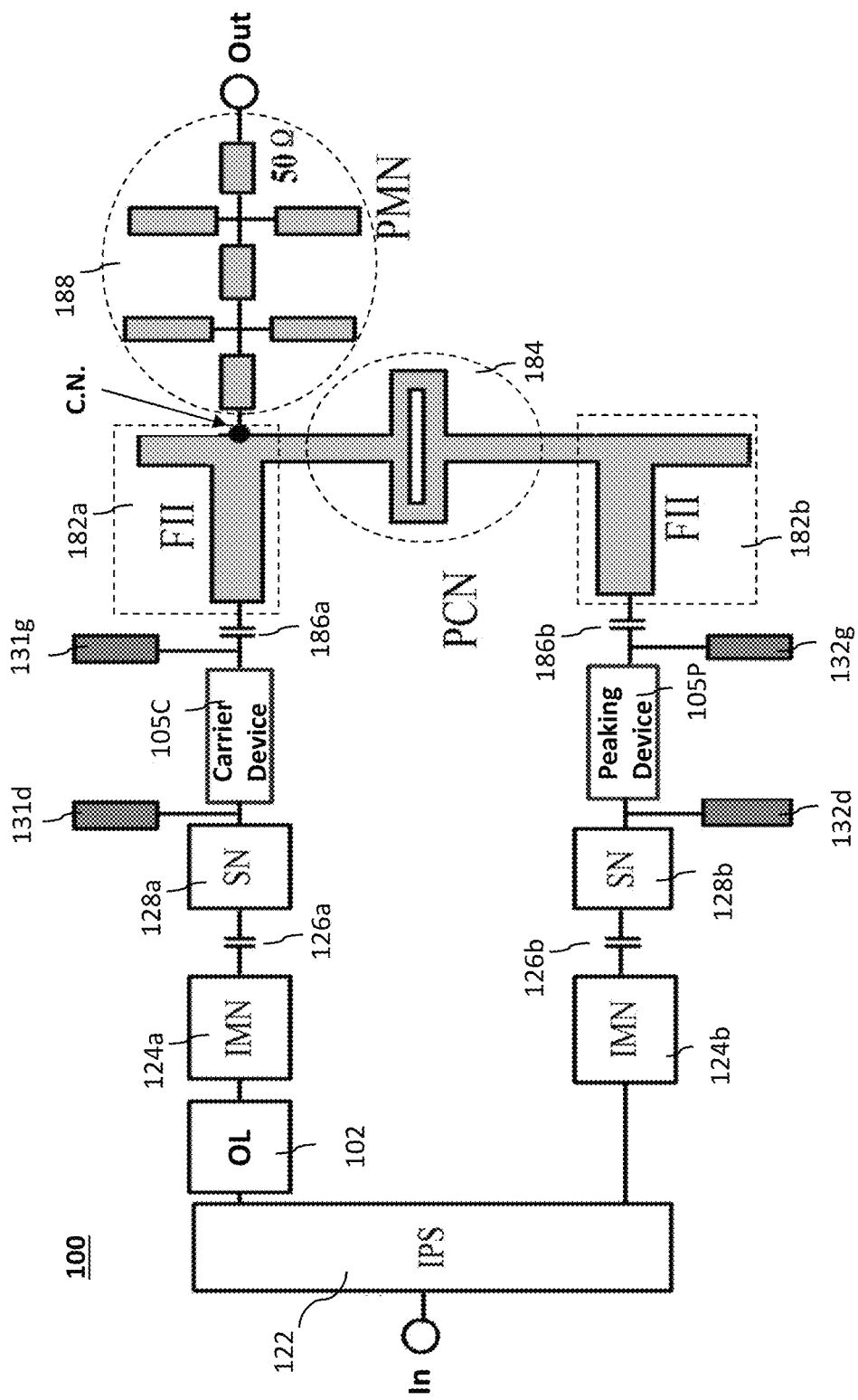
FIG. 1 shows a high-level circuit diagram of a Doherty power amplifier (DPA) according to one embodiment of the invention.

FIG. 1 shows a high-level circuit diagram of a Doherty power amplifier (DPA) 100 according to one embodiment of the invention. Referring to FIG. 1, the DPA 100 includes an input port (In), an output port (Out), a main power amplification device ("carrier device") 105C; and an auxiliary power amplification device ("peaking device") 105P arranged in parallel with the main power amplification device/

The DPA 100 further includes an input power splitter (IPS) 122 having an input connected with the input port, a first (upper) branching network connected between a first output of the IPS 122 and the carrier device 105C and a second (lower) branching network connected between a second output of the IPS 122 and the peaking device 105P.

The first (upper) branching network includes an offset line (OL) 102 having a first end connected to the first output of the IPS 122, an input matching network (IMN) 124a having an input connected to an output of the OL 102, a stabilized network (SN) 128a having an input connected to an output of the IMN 124a through a DC block 126a and an output connected to an input of the carrier device 105C.

The second (lower) branching network includes an IMN 124b having an input connected to a second output of the IPS 122, a SN 128b having an input connected to an output of the IMN 124b through a DC block 126b and an output connected to an input of the pealing device 105P.

The carrier device 105C may be biased by a biasing network. The carrier device 105C may include a power transistor which can be of any suitable types for different power applications. The power transistor of the carrier device 105C may have a drain terminal and a gate terminal being with a drain bias 131d and a gate bias 131g respectively. Preferably, the drain bias is 20V such that the carrier device 105C is biased to operate as a Class AB amplifier (in particular a deep Class AB amplifier).

The peaking device 105P may be biased by a biasing network. The peaking device 105P may include a power transistor which can be of any suitable types for different power applications. The power transistor of the peaking device 105P may have a drain terminal and a gate terminal with a drain bias 132d and a gate bias 132g respectively. Preferably, the drain bias is 28V and the peaking device 105C is biased to operate as a Class C amplifier (in particular a deep Class C amplifier).

It should be understood that the power transistors used for forming the carrier and peaking devices can be of any types.

The asymmetrical drain biased carrier device 105C (at 20 V) and peaking device 105P (at 28 V) can be considered as two current sources in phase quadrature. Hence, the peaking device 105P behaves as a voltage controlled current source providing the current to modulate the load impedance of the carrier device 105C for Doherty behavior.

The DPA 100 further includes a fundamental impedance inverter (FII) 182a having an input connected to an output of the carrier device 105C though a DC block 186a, a FII 182b having an input connected to an output of the peaking device 105P though a DC block 186b, a coupled phase compensation network (PCN) 184 connected across respective outputs of the two FII 182a, 182b; and a post matching network (PMN) 188 having an input connected to a combining node (C.N.) combining signals from the carrier device and the peaking device, and an output connected to the output port, to which a load may be connected.

Figure 2:
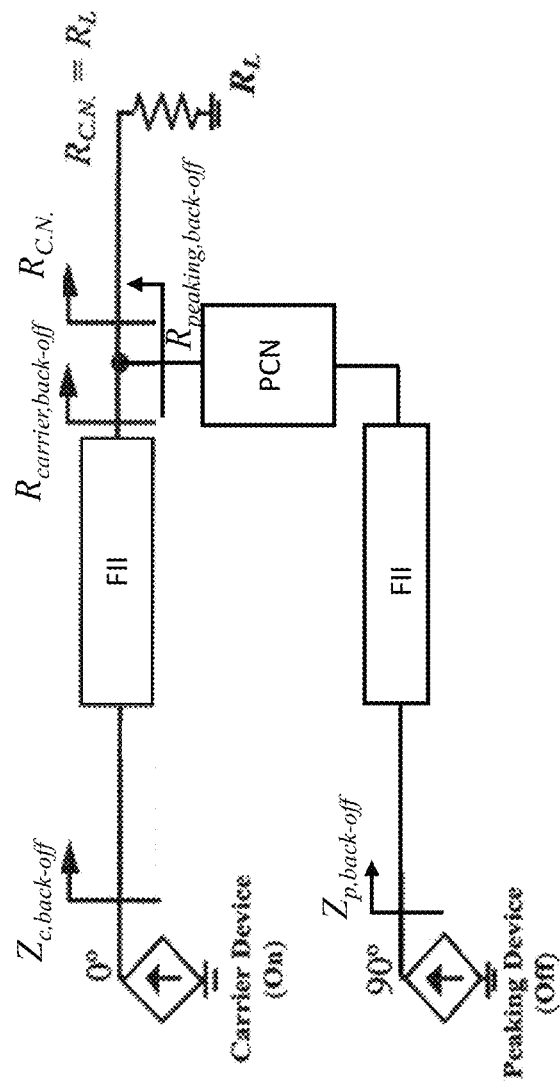
FIG. 2 shows operation of an asymmetrical drain biased DPA below/at back-off point.

FIG. 2 shows operation of the asymmetrical drain biased DPA 100 below/at back-off point. As shown in FIG. 2, at the back-off point, only the carrier device is conducting, the output impedance of the carrier branch is equal to the impedance at the combing node, which in turn equal to the load impedance. Below the back-off point, the output impedance toward the peaking branch should be infinite to prevent power leakage from the carrier branch. Therefore, the fundamental load impedances at the back-off point should satisfy the following conditions:

$$R_{carrier,back-off} \text{ at } f_0 = R_{C.N.} = R_L, R_{peaking,back-off} \text{ at } f_0 = \infty \quad (1)$$

where $R_{carrier,back-off}$ refers to the output impedance of carrier branch at back-off point, $R_{C.N.}$ refers to impedance at the combing node, $R_{peaking,back-off}$ refers to the output impedance of the peaking branch at back-off point, $R_L$ is the load impedance and $f_0$ is the fundamental operation frequency.

Figure 3:
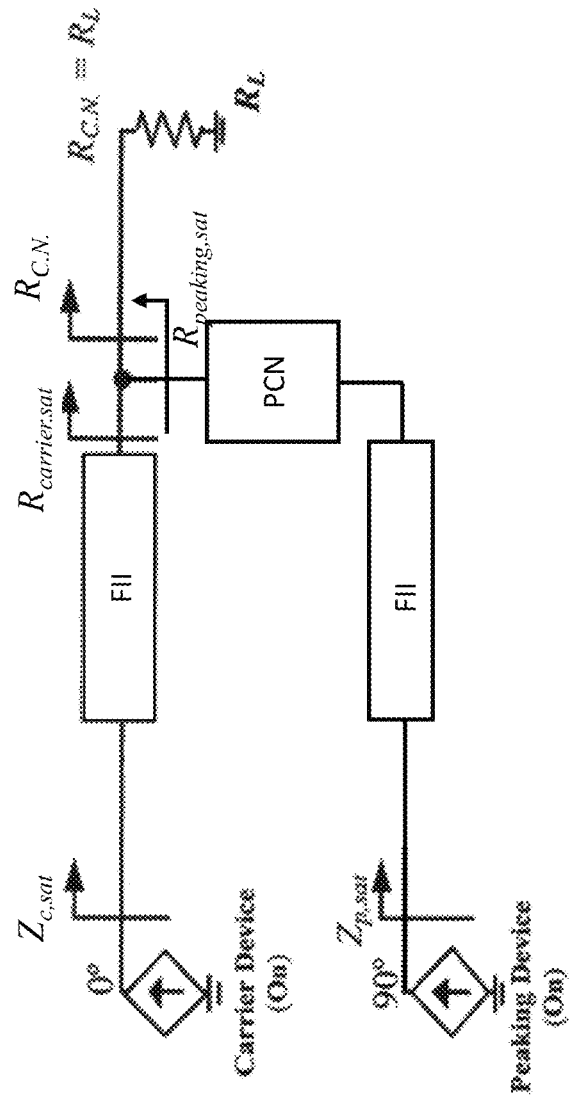
FIG. 3 shows operation of an asymmetrical drain biased DPA at saturation.

FIG. 3 shows operation of the asymmetrical drain biased DPA 100 at saturation. As shown in FIG. 3, at saturation, both the carrier and peaking devices are conducting, the output impedances of carrier branch and peaking branch are both $2R_L$ in order to maintain an $R_{C.N.}$ impedance. Therefore, the fundamental load impedances at saturation should satisfy the following conditions $$R_{carrier,sat} \text{ at } f_0 = 2R_L, R_{peaking,sat} \text{ at } f_0 = 2R_L \quad (2)$$

where $R_{carrier,sat}$ refers to the output impedance of carrier branch at saturation, $R_{peaking,back-off}$ refers to the output impedance of the peaking branch at saturation.

The function of the PCN is to compensate for the 90° phase shift between the carrier and peaking devices which may cause mismatch at the fundamental frequency, so as to increase the operating bandwidth. The impedance looking into the PCN should be set to $2R_L$ in order to prevent power loss in the peaking branch. After that, the PMN transforms the "real-to-real" impedance from system load ($R_0$) to combining node ($R_{C.N.}$).

Design of the carrier FII needs to satisfy the load conditions at back-off and at saturation simultaneously. Since the carrier FII adopts a L-type configuration, which can be readily modelled as an LC tank-equivalent circuit, the drain impedance seen by the carrier device, $Z_{carrier}$, can be expressed as $$Z_{carrier} = j\omega L + \cfrac{1}{j\omega C + \cfrac{1}{R}} \quad (3)$$

This expression can be expanded into its real and imaginary parts as $$Z_{carrier} = \frac{R}{1 + R^2\omega^2 C^2} + j\left(\omega L - \frac{\omega C}{\omega^2 C^2 + \frac{1}{R^2}}\right) \quad (4)$$

The load modulation result at back-off point is $R=R_L$. The load modulation result at saturation is $R=(1+\alpha)R_L$, where $\alpha=P_{sat,p}/P_{sat,c}$, with $P_{sat,c}$ and $P_{sat,p}$ referring to the saturated carrier and peaking fundamental power. It is required that the real part of $Z_{carrier}$ does not change at $\omega=\omega_0=2\pi f_0$, that is:

$$\frac{R_L}{1 + R_L^2 \omega_0^2 C^2} = \frac{(1+\alpha)R_L}{1 + ((1+\alpha)R_L)^2 \omega_0^2 C^2} \quad (5)$$

Eq. (5) can be rearranged in terms of ωo which is given by $$\omega_0 = \sqrt{\frac{1}{(1+\alpha)C^2 R_L^2}} \quad (6)$$

Therefore, the real part of $Z_{carrier}$ at $\omega_0$, has a relationship with $R_L$ and $\alpha$, given by $$\text{Re}\{Z_{carrier,sat}\} = \frac{R_L(1+\alpha)}{2+\alpha} \quad (7)$$

Based on the above, the value of C can be determined by Eq. (6) and L should be tuned to an appropriate value based on load-pull data.

Figure 4B:
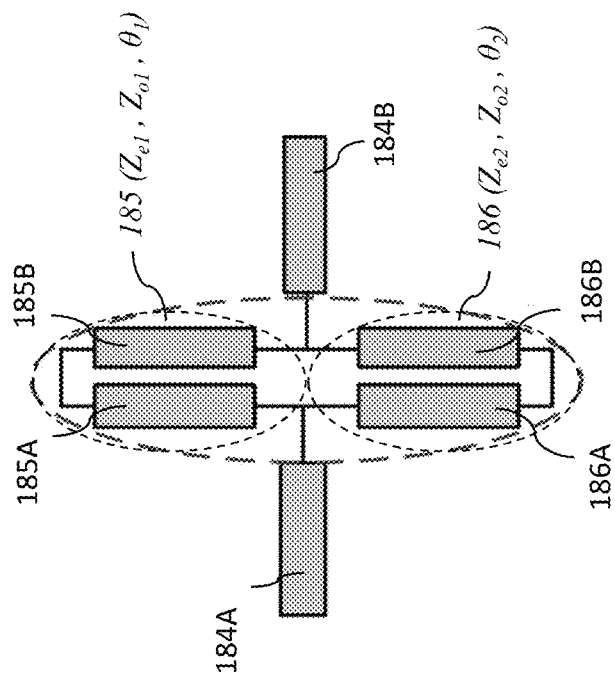
FIGS. 4A and 4B show detailed physical design and circuit geometry respectively of a coupled phase compensation network according to one embodiment of the invention.
Figure 4A:
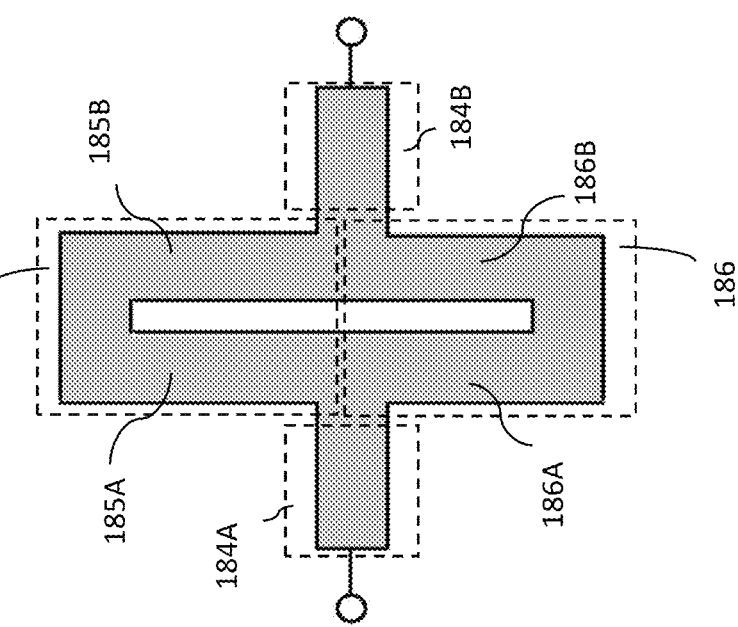

FIGS. 4A and 4B show detailed physical design and circuit geometry of the coupled PCN 184 of FIG. 1 respectively. As shown in FIGS. 4A and 4B, the PCN 184 includes a transmission line section 184A, a transmission line section 184B extending generally collinearly with the transmission line section 184A, two pairs of end-connected coupled transmission lines 185, 186 connected in parallel between the transmission line section 184A and the transmission line section 184B. Each of the end-connected coupled lines 185, 186 is substantially symmetrical.

The pair of end-connected coupled transmission lines 185 includes a transmission line section 185A with a first end and a second end; and a transmission line section 185B with a first end and a second end, arranged adjacent and in parallel with the transmission line section 185A. The transmission line section 185A generally extends substantially perpendicularly from the transmission line section 184A. The transmission line section 185B generally extends substantially perpendicularly from the transmission line section 184B.

The pair of end-connected coupled transmission lines 186 includes a transmission line section 186A with a first end and a second end; and a transmission line section 186B with a first end and a second end, arranged adjacent and in parallel with the transmission line section 186A. The transmission line section 186A generally extends perpendicularly from the transmission line section 184A. The transmission line section 186B generally extends perpendicularly from the transmission line section 184B.

The first end of the transmission line section 185A is directly connected with the first transmission line section 184A. The first end of the transmission line section 185B is directly connected with the transmission line section 184B. The second end of the transmission line section 185A and the second end of the transmission line section 185B are directly connected with each other to provide the end-connected coupling. In other words, the transmission line sections 184A, 184B, 185A, 185B form a continuous transmission line.

The first end of the transmission line section 186A is directly connected with the first transmission line section 184A. The first end of the transmission line section 186B is directly connected with the transmission line section 184B. The second end of the transmission line section 186A and the second end of the transmission line section 186B are directly connected with each other to provide the end-connected coupling. In other words, the transmission line sections 184A, 184B, 186A, 186B form a continuous transmission line.

Each pair of the end-connected coupled lines 185, 186 has even and odd mode impedances $Z_{ei}$, $Z_{oi}$ respectively, and an electrical length of $\theta_i$, where i=1, 2. The ABCD matrix parameters for each pair of the end-connected coupled lines 185, 186 in series are:

$$\begin{bmatrix} A_i & B_i \\ C_i & D_i \end{bmatrix} = \begin{bmatrix} \dfrac{Z_{ei}\cot\theta_i - Z_{oi}\tan\theta_i}{Z_{ei}\cot\theta_i + Z_{oi}\tan\theta_i} & \dfrac{2jZ_{ei}Z_{oi}}{Z_{ei}\cot\theta_i + Z_{oi}\tan\theta_i} \\ \dfrac{2j}{Z_{ei}\cot\theta_i + Z_{oi}\tan\theta_i} & \dfrac{Z_{ei}\cot\theta_i - Z_{oi}\tan\theta_i}{Z_{ei}\cot\theta_i + Z_{oi}\tan\theta_i} \end{bmatrix} (i=1,2) \quad (8)$$

The ABCD matrix of its parallel equivalence can then be found by:

$$\begin{bmatrix} A_{ip} & B_{ip} \\ C_{ip} & D_{ip} \end{bmatrix} = \begin{bmatrix} A_i & C_i \\ \dfrac{1}{B_i} & D_i \end{bmatrix} \begin{bmatrix} \dfrac{Z_{ei}\cot\theta_i - Z_{oi}\tan\theta_i}{Z_{ei}\cot\theta_i + Z_{oi}\tan\theta_i} & \dfrac{2j}{Z_{ei}\cot\theta_i + Z_{oi}\tan\theta_i} \\ -\dfrac{j(Z_{ei}\cot\theta_i + Z_{oi}\tan\theta_i)}{2Z_{ei}Z_{oi}} & \dfrac{Z_{ei}\cot\theta_i - Z_{oi}\tan\theta_i}{Z_{ei}\cot\theta_i + Z_{oi}\tan\theta_i} \end{bmatrix} (i=1,2) \quad (9)$$

With the parallel equivalent ABCD matrices, the two end-connected coupled lines 185, 186 can then be analyzed by cascading the ABCD matrices. The parallel equivalent ABCD matrix of the two end-connected coupled lines 185, 186 can then be expressed as:

$$\begin{bmatrix} A_{ParaPCN} & B_{ParaPCN} \\ C_{ParaPCN} & D_{ParaPCN} \end{bmatrix} = \quad (10)$$

$$\begin{bmatrix} \dfrac{Z_{e1}\cot\theta_1 - Z_{o1}\tan\theta_1}{Z_{e1}\cot\theta_1 + Z_{o1}\tan\theta_1} & \dfrac{2j}{Z_{e1}\cot\theta_1 + Z_{o1}\tan\theta_1} \\ -\dfrac{j(Z_{e1}\cot\theta_1 + Z_{o1}\tan\theta_1)}{2Z_{e1}Z_{o1}} & \dfrac{Z_{e1}\cot\theta_1 - Z_{o1}\tan\theta_1}{Z_{e1}\cot\theta_1 + Z_{o1}\tan\theta_1} \end{bmatrix}$$

$$\begin{bmatrix} \dfrac{Z_{e2}\cot\theta_2 - Z_{o2}\tan\theta_2}{Z_{e2}\cot\theta_2 + Z_{o2}\tan\theta_2} & \dfrac{2j}{Z_{e2}\cot\theta_2 + Z_{o2}\tan\theta_2} \\ -\dfrac{j(Z_{e2}\cot\theta_2 + Z_{o2}\tan\theta_2)}{2Z_{e2}Z_{o2}} & \dfrac{Z_{e2}\cot\theta_2 - Z_{o2}\tan\theta_2}{Z_{e2}\cot\theta_2 + Z_{o2}\tan\theta_2} \end{bmatrix}$$

Afterwards, the ABCD matrix parameters of the cascaded PCN 184 can be obtained by performing the following transformation:

$$\begin{bmatrix} A_{PCN} & B_{PCN} \\ C_{PCN} & D_{PCN} \end{bmatrix} = \begin{bmatrix} A_{ParaPCN} & \dfrac{1}{C_{ParaPCN}} \\ B_{ParaPCN} & \dfrac{1}{D_{ParaPCN}} \end{bmatrix} \quad (11)$$

Assuming that the networks are lossless, reciprocal and symmetrical, to achieve the ideal conditions of $A_{PCN}D_{PCN} - B_{PCN}C_{PCN} = 1$, $A_{PCN} = D_{PCN} = 1$, the value of $C_{PCN}$ must equal to 0, that is:

$$\dfrac{Z_{e1}\cot\theta_1 - Z_{o1}\tan\theta_1}{Z_{e1}\cot\theta_1 + Z_{o1}\tan\theta_1} \dfrac{2j}{Z_{e2}\cot\theta_2 + Z_{o2}\tan\theta_2} + \quad (12)$$
$$\dfrac{Z_{e2}\cot\theta_2 - Z_{o2}\tan\theta_2}{Z_{e2}\cot\theta_2 + Z_{o2}\tan\theta_2} \dfrac{2j}{Z_{e1}\cot\theta_1 + Z_{o1}\tan\theta_1} = 0$$

In this embodiment, the end-connected coupled lines 185, 186 may be selected to have identical geometry and same characteristics such as even and odd mode impedances and electrical length. By letting $Z_{e1}=Z_{e2}=Z_e$, $Z_{o1}=Z_{o2}=Z_o$, and $\theta_1=\theta_2=\theta$, it can then be found that the following relationship between $Z_e$, $Z_o$ and $\theta$ should be satisfied.

$$\cot\theta = \sqrt{Z_e Z_o} \quad (13)$$

The PCN 184 can also be considered to be two micro-strip lines in parallel with the addition of electrical coupling. This additional coupling leads to a smaller external quality factor ($Q_E$). When viewed on the Smith chart, the trajectory can be seen to follow a "circular path". This path can be seen as the peaking device being able to operate over a wider frequency range. It should be noted that the characteristics ($Z_e$, $Z_o$ and $\theta$) of the selected coupled lines should satisfy the condition in Eq. (13).

Furthermore, the electrical length of the PCN 184 should be equal to the phase difference between the carrier and peaking devices 150C, 150P. This is calculated using the ratio of drain currents, which is given, in polar coordinates, by:

$$\dfrac{I_c}{I_p} = \alpha e^{j\Theta_p} \quad (14)$$

where $I_c$ is the drain current of the carrier device, $I_p$ is the drain current of the peaking device, and $\Theta_p$ is the phase difference between the carrier and peaking devices.

Therefore, the two transmission lines 184A, 184B should be added to satisfy the phase requirement of the entire PCN.

FIG. 5A shows circuit geometry of an entire peaking branch including a L-type FII coupling with a PCN according to an embodiment of the invention, in which the odd/even mode impedance and electrical length of the two end-connected coupled lines are set equal, namely, $Z_{e1}=Z_{e2}=124\Omega$, $Z_{o1}=Z_{o2}=65.4\Omega$, and $\theta_1=\theta_2=20°$. FIG. 5B shows geometry of an entire peaking branch including a L-type FII coupling with a conventional PCN which is formed with a microstrip line.

It should be note that although in this embodiment, the odd/even mode impedance and electrical length of the two end-connected coupled lines are set equal, in other embodiments, the values of the odd/even mode impedance of the two end-connected coupled lines can be different, that is $Z_{e1} \neq Z_{e2}$, $Z_{o1} \neq Z_{o2}$.

Figure 6:
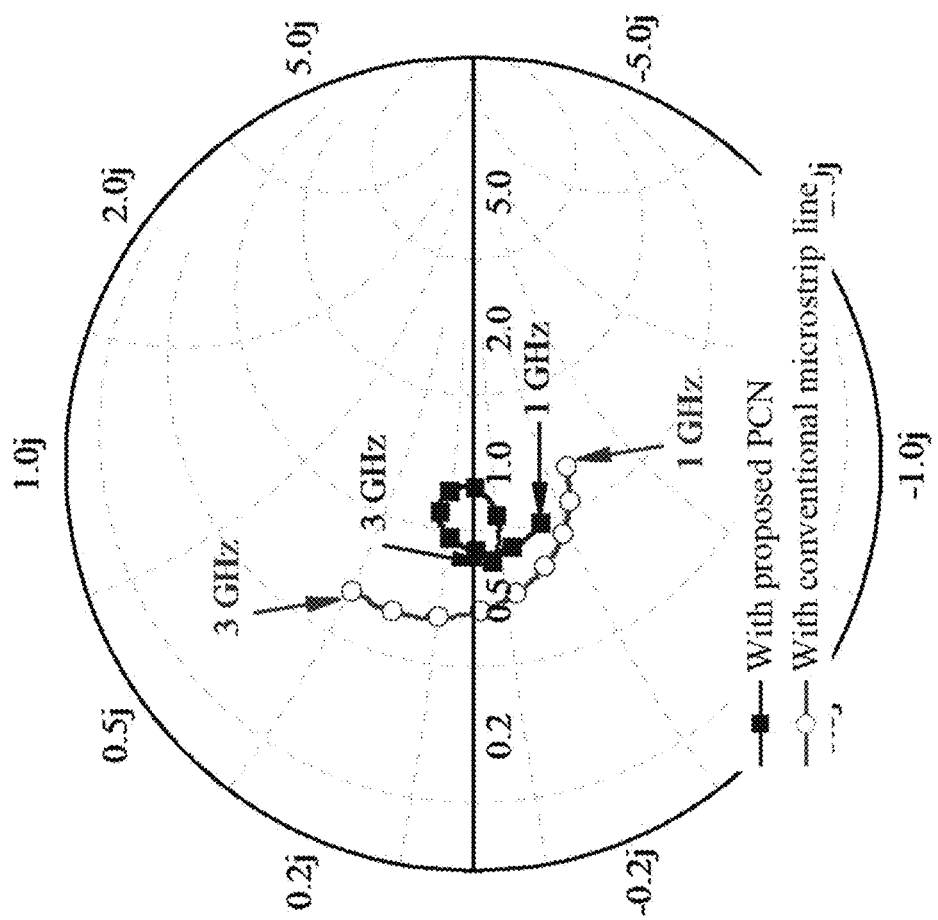
FIG. 6 shows an input impedance ($Z_{IN\_A}$) trajectory of the peaking branch of FIG. 5A and an input impedance ($Z_{IN\_B}$) trajectory of the peaking branch of FIG. 5B, respectively.

FIG. 6 shows an input impedance ($Z_{IN\_A}$) trajectory of the peaking branch of FIG. 5A and an input impedance ($Z_{IN\_B}$) trajectory of the peaking branch of FIG. 5B. As shown in FIG. 6, an additional circle within the Smith chart for the $Z_{IN\_A}$ trajectory can be seen. This proves that $Q_E$ of the entire peaking branch for the provided PCN is reduced compared with the conventional PCN. Thus, this smaller variation verifies that the coupled PCN can provide a wider bandwidth.

Figure 7:
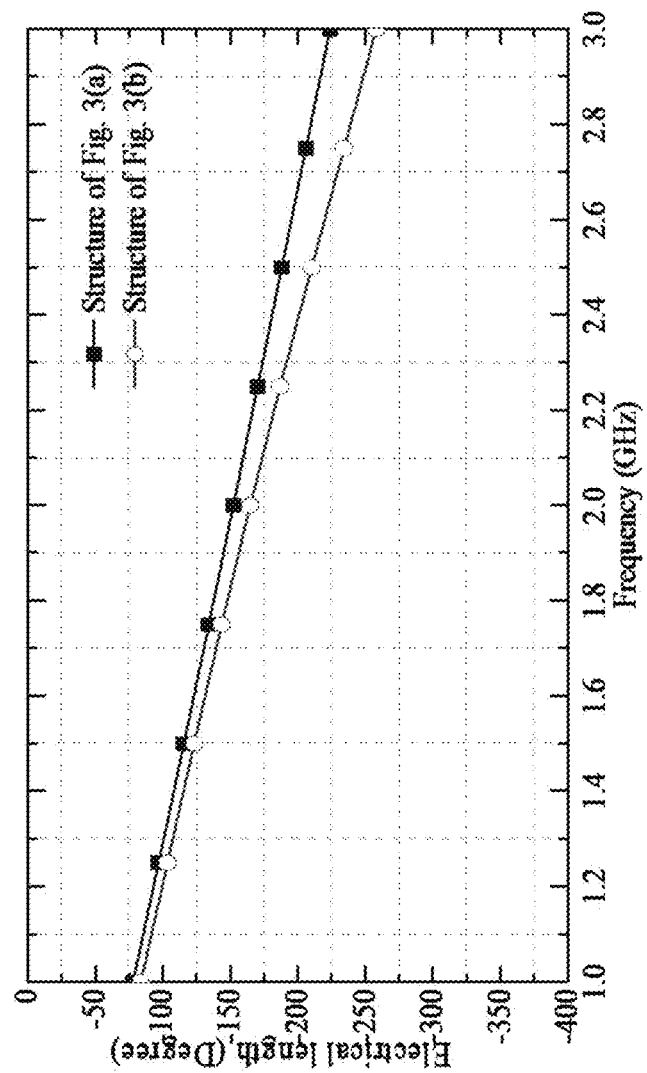
FIG. 7 shows the electrical length ($\theta_A$) of the peaking branch of FIG. 5A and the electrical length ($\theta_B$) of the peaking branch of FIG. 5B, respectively.

FIG. 7 shows the electrical length ($\theta_A$) of the peaking branch of FIG. 5A and the electrical length ($\theta_B$) of the peaking branch of FIG. 5B, respectively. Both can be seen to have similar electrical lengths. It should be noted that due to parasitic effects of the active device, the entire peaking branch electrical length at center frequency is not necessarily designed to be the ideal 180°.

Figure 8B:
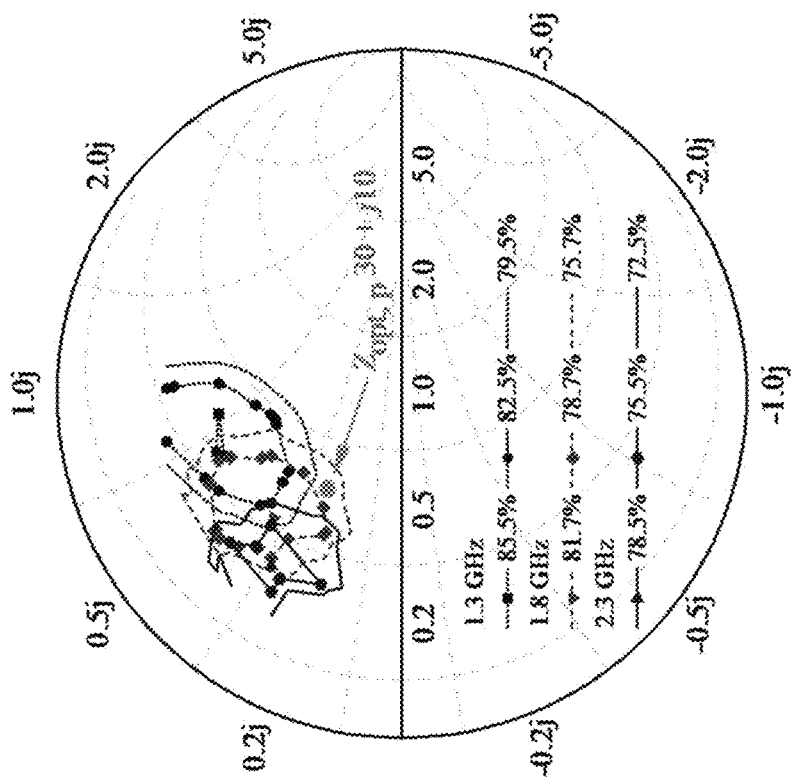
FIGS. 8A and 8B show the optimal impedance of $Z_{carrier}$ (denoted as $Z_{opt,c}$), and $Z_{peaking}$ (denoted as $Z_{opt,p}$) at saturation over the entire operating frequency respectively.
Figure 8A:
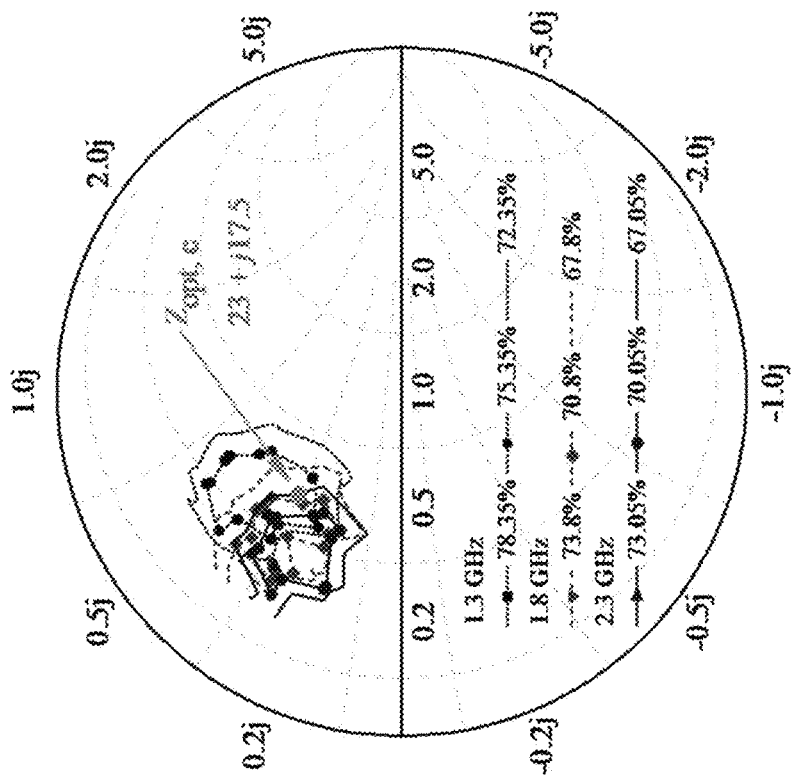

FIGS. 8A and 8B show the optimal impedance of $Z_{carrier}$ (denoted as $Z_{opt,c}$), and $Z_{peaking}$ (denoted as $Z_{opt,p}$) at saturation over the entire operating frequency respectively, which can be obtained using the load pull simulator in Keysight ADS software. Referring to FIG. 8A, for the carrier device, the selection strategy for $Z_{opt,c}$ is to find an impedance to achieve the best trade-off performance over the entire operating frequency range. Meanwhile, the imaginary part should be as small as possible. That is because the effect of the L-type FII is movement of the imaginary part of $Z_{carrier}$ towards the real axis when going from back-off to saturation. Hence, $Z_{opt,c}$ at saturation is then required to have a small imaginary part. Finally, $Z_{opt,c}$ is chosen to be $23+j17.5\Omega$. Referring to FIG. 8B, for the peaking device, it is not wise to select $Z_{opt,p}$ in conjunction with a large imaginary part because the transistor at 1.3 GHz still exhibits high efficiency even with $Z_{opt,p}$ being far away from its highest efficiency point. Eventually, $Z_{opt,p}$ is selected to be $30+j10\Omega$. With the help of this optimal impedance selection strategy, the DPA can achieve an excellent trade-off in performance between back-off efficiency, saturated efficiency and saturated output power.

Figure 9A:
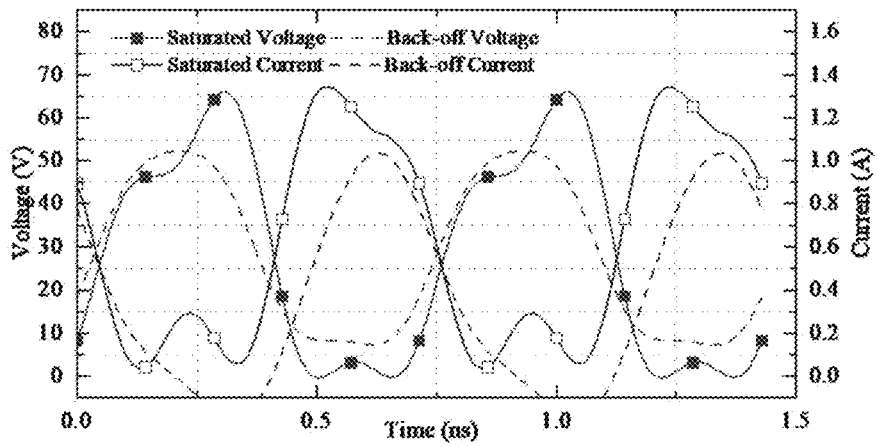
FIGS. 9A-9C show time-domain voltage and current waveforms of the DPA at operating frequencies $f_{low}$ (1.3 GHz), $f_0$ (1.8 GHz) and $f_{high}$ (2.3 GHz) respectively.
Figure 9B:
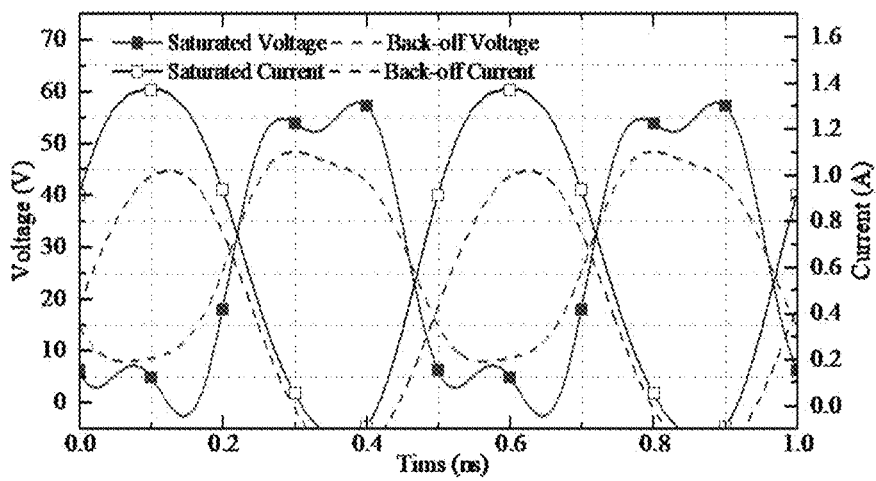
Figure 9C:
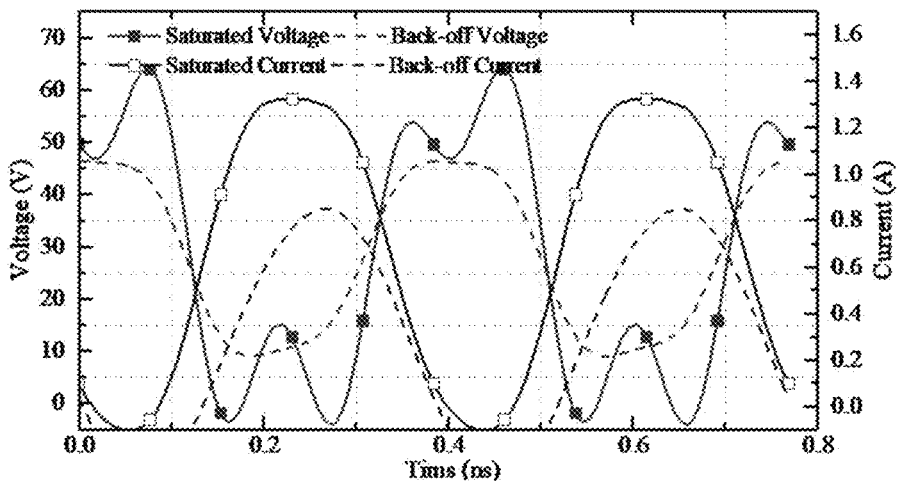

FIGS. 9A-9C show time-domain voltage and current waveforms of the DPA at operating frequencies $f_{low}$, (1.3 GHz), $f_0$ (1.8 GHz) and $f_{high}$ (2.3 GHz) respectively, which are over the entire operating frequency range. It can be seen that at back-off point, the voltage swing reached its maximum amplitude while the current swing reached half its maximum swing. At saturation, both voltage and current reach their maximum swing.

A Doherty power amplifier (DPA) is designed and fabricated based on the circuit diagram of FIG. 1 using Rogers substrates. Experiments and test were performed on the fabricated Doherty power amplifier, results of which are shown in the graphs of FIGS. 10 to 13.

Figure 10:
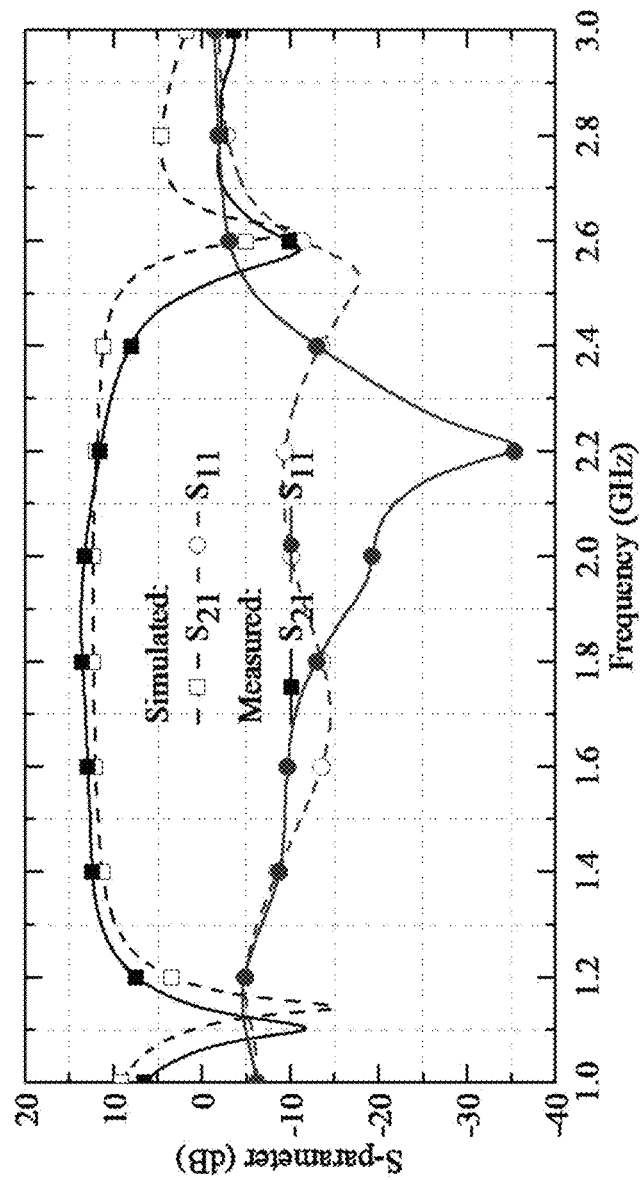
FIG. 10 shows the simulated and measured small signal performance of a fabricated DPA at various operating frequencies from 1.3 GHz to 2.3 GHz.

FIG. 10 shows the simulated and measured small signal performance of the fabricated DPA at various operating frequencies from 1.3 GHz to 2.3 GHz. There is good agreement between simulation and measurements. The gain was higher than 10 dB from 1.3 GHz to 2.3 GHz.

Figure 11A:
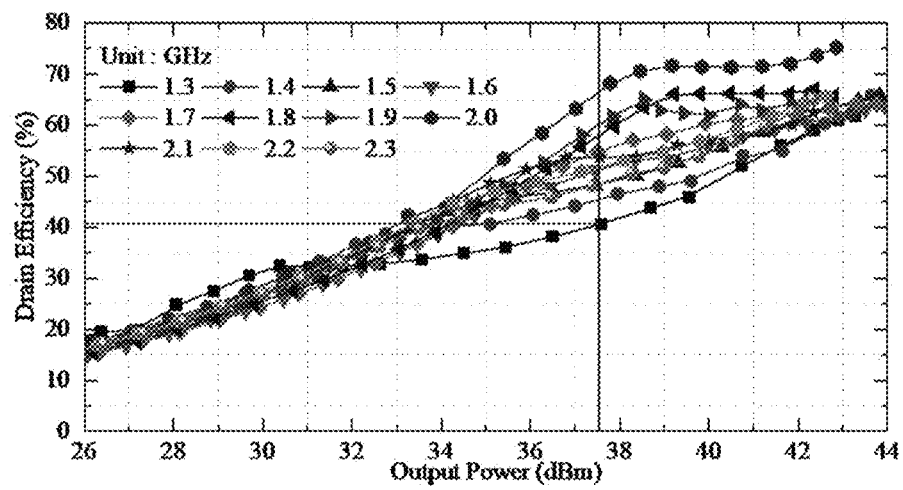
FIG. 11A shows the simulated drain efficiency of the fabricated DPA with respect to the output power at various operating frequencies from 1.3 GHz to 2.3 GHz.

FIG. 11A shows the simulated drain efficiency of the fabricated DPA with respect to the output power at various operating frequencies from 1.3 GHz to 2.3 GHz. It can be observed that Doherty behavior was successfully realized over the entire band, and exhibited higher than 44.5% drain efficiency (η) at 6 dB OBO (37 dBm) covering a bandwidth of 1 GHz (1.3 GHz to 2.3 GHz).

Figure 11B:
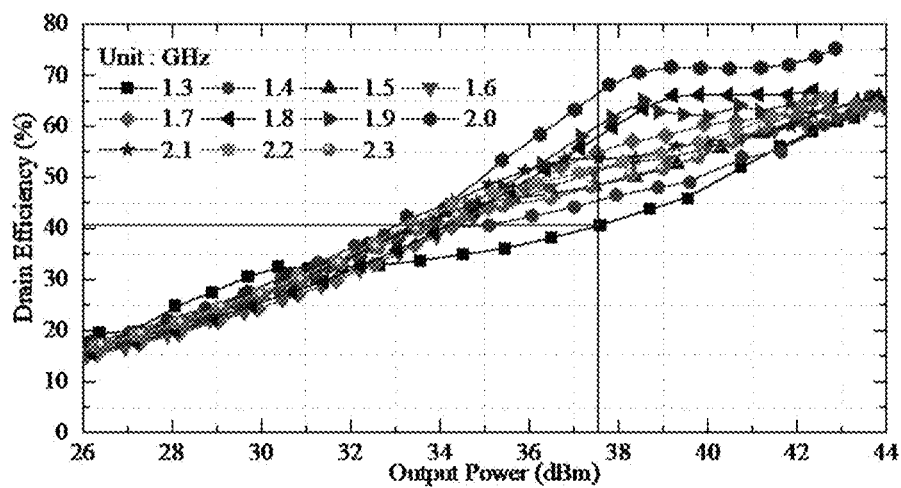
FIG. 11B shows the measured drain efficiencies of the fabricated DPA with respect to the output power at various operating frequencies from 1.3 GHz to 2.3 GHz.

FIG. 11B shows the measured drain efficiencies of the DPA with respect to the output power at various operating frequencies from 1.3 GHz to 2.3 GHz. It can be observed that Doherty behavior was successfully realized over the entire band, and exhibited higher than 41% drain efficiency (η) at 6 dB OBO (37 dBm) covering a bandwidth of 1 GHz (1.3 GHz to 2.3 GHz).

Figure 12:
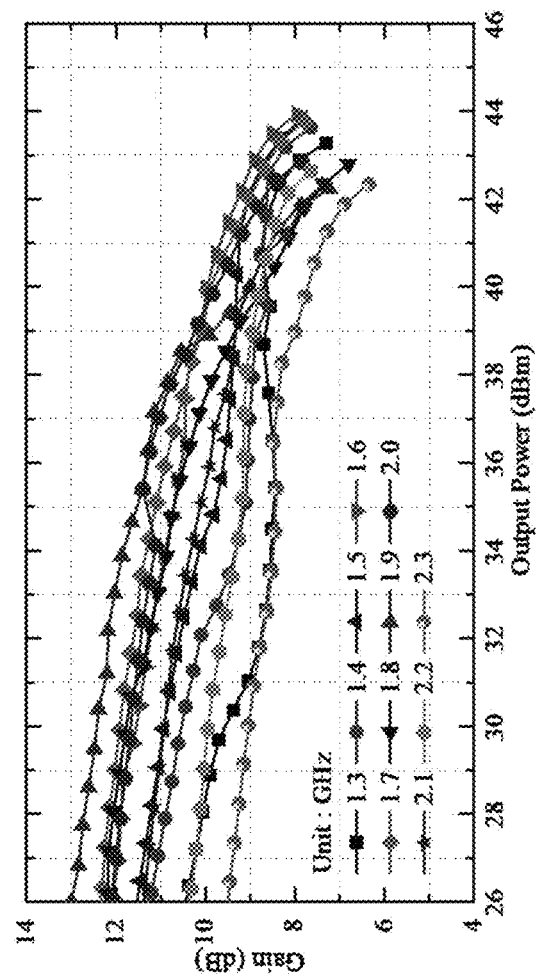
FIG. 12 shows measured gain of the fabricated DPA with respect to the output power at various operating frequencies from 1.3 GHz to 2.3 GHz.

FIG. 12 shows measured gain of the fabricated DPA with respect to the output power at various operating frequencies from 1.3 GHz to 2.3 GHz. It can be observed that the gain decreases from 12.1 dB to 9.7 dB with varying output power. The compression point at saturation is less than 3.2 dB over the entire frequency range.

Figure 13:
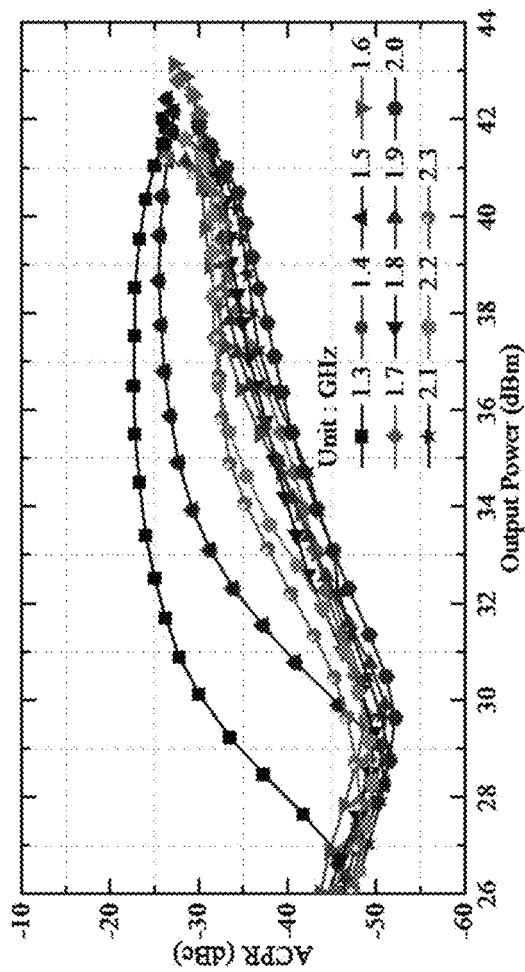
FIG. 13 shows measured adjacent channel power ratios (ACPRs) of the fabricated DPA under modulated signal excitation at various operating frequencies from 1.3 GHz to 2.3 GHz.

FIG. 13 shows measured adjacent channel power ratios (ACPRs) of the fabricated DPA under modulated signal excitation at various operating frequencies from 1.3 GHz to 2.3 GHz. It can be observed that the lower ACPR performance of the DPA was better than −25.9 dBc at saturation and −22.7 dBc at back-off from 1.3 to 2.3 GHz.

Figure 14A:
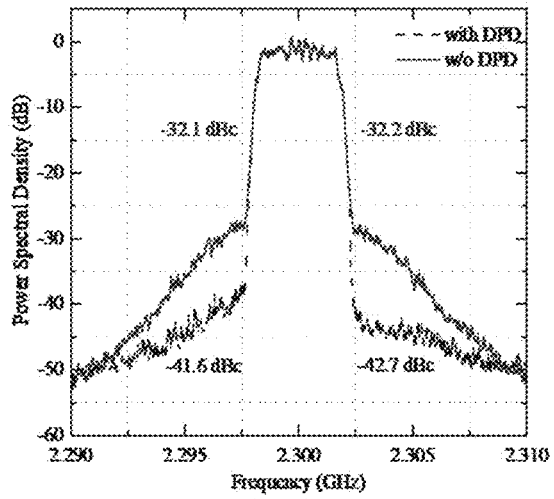
FIGS. 14A-14C shows the normalized power spectral density of the fabricated DPA at operating frequencies $f_{low}$ (1.3 GHz), $f_0$ (1.8 GHz) and $f_{high}$ (2.3 GHz) respectively.
Figure 14B:
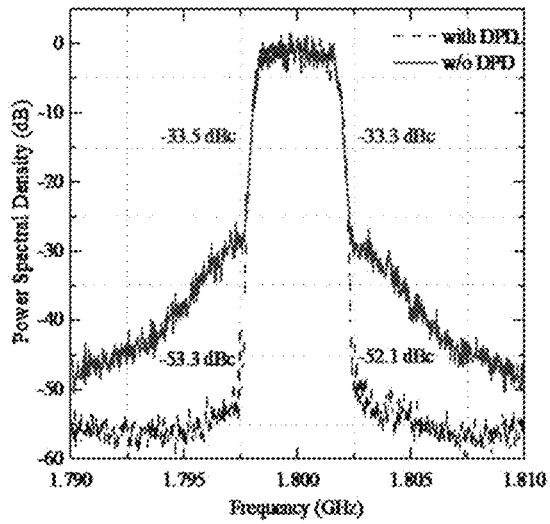
Figure 14C:
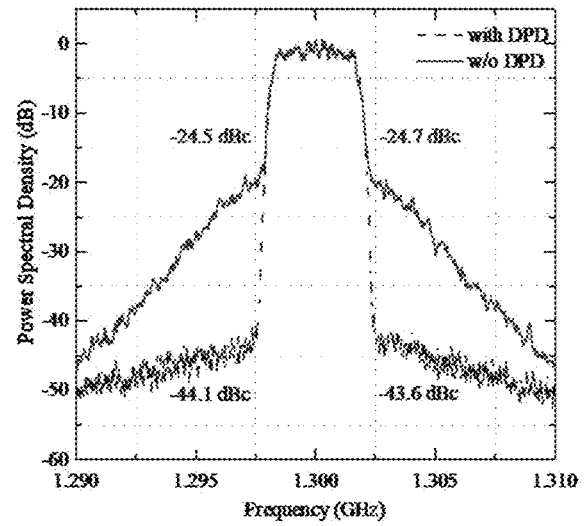

FIGS. 14A-14C shows the normalized power spectral density of the fabricated DPA at operating frequencies $f_{low}$ (1.3 GHz), $f_0$ (1.8 GHz) and $f_{high}$ (2.3 GHz) respectively. The designed DPA was linearized by using digital pre-distortion (DPD) based on the dynamic deviation reduction Volterra series. For the measurement, the linearization was performed at the back-off output power of 37.5 dBm. After linearization, the DPA achieved better than −44.1 dBc (1.3 GHz), −53.3 dBc (1.8 GHz) and −41.6 dBc (2.3 GHz) at back-off, respectively.

The foregoing description of the present invention has been provided for the purposes of illustration and description. It is not intended to be exhaustive or to limit the invention to the precise forms disclosed. Many modifications and variations will be apparent to the practitioner skilled in the art.

The apparatuses and the methods in accordance to embodiments disclosed herein may be implemented using computing devices, computer processors, or electronic circuitries and other programmable logic devices configured or programmed according to the teachings of the present disclosure. Computer instructions or software codes running in the computing devices, computer processors, or programmable logic devices can readily be prepared by practitioners skilled in the software or electronic art based on the teachings of the present disclosure.

All or portions of the methods in accordance to the embodiments may be executed in one or more computing devices including server computers, personal computers, laptop computers, mobile computing devices such as smartphones and tablet computers.

The embodiments were chosen and described in order to best explain the principles of the invention and its practical application, thereby enabling others skilled in the art to understand the invention for various embodiments and with various modifications that are suited to the particular use contemplated.

What is claimed is:

1. A wideband Doherty power amplifier comprising:
   a main power amplification device;
   an auxiliary power amplification device arranged in parallel with the main power amplification device;
   a first fundamental impedance inverter having an input connected to an output of the main power amplification device through a first DC block;
   a second fundamental impedance inverter having an input connected to an output of the auxiliary power amplification device through a second DC block;
   a coupled phase compensation network connected across respective outputs of the first and second fundamental impedance inverters and configured for compensating a phase shift between the main power amplification device and the auxiliary power amplification device;
   wherein the coupled phase compensation network comprises:
      a first transmission line section connected with the first fundamental impedance inverter;
      a second transmission line section connected with the second fundamental impedance inverter; and
      a first and a second pairs of end-connected coupled transmission lines, both connected in parallel between the first transmission line section and the second transmission line section.

2. The wideband Doherty power amplifier according to claim 1, wherein the compensated phase shift is substantially equal to 90°.

3. The wideband Doherty power amplifier according to claim 1, wherein the first and second pairs of end-connected coupled transmission lines are configured to fulfill a phase requirement given by:

$$\frac{Z_{e1}\cot\theta_1 - Z_{o1}\tan\theta_1}{Z_{e1}\cot\theta_1 + Z_{o1}\tan\theta_1} \frac{2j}{Z_{e2}\cot\theta_1 + Z_{o2}\tan\theta_1} + \frac{Z_{e2}\cot\theta_2 - Z_{o2}\tan\theta_2}{Z_{e2}\cot\theta_2 + Z_{o2}\tan\theta_2} \frac{2j}{Z_{e1}\cot\theta_1 + Z_{o1}\tan\theta_1} = 0$$

where $Z_{e1}$, $Z_{o1}$ and $\theta_1$, are even mode impedance, odd mode impedance and electrical length of the first pair of end-connected coupled transmission lines, and $Z_{e2}$, $Z_{o2}$ and $\theta_2$, are even mode impedance, odd mode impedance and electrical length of the second pair of end-connected coupled transmission lines.

4. The wideband Doherty power amplifier according to claim 1, wherein each of the first and second fundamental impedance inverters has an L-type circuit topology.

5. The wideband Doherty power amplifier according to claim 1, wherein:
   the first pair of end-connected coupled transmission lines comprises:

a third transmission line section extending substantially perpendicularly from the first transmission line section; and a fourth transmission line section extending substantially perpendicularly from the second transmission line section; and the second pair of end-connected coupled transmission lines comprises:

a fifth transmission line section extending substantially perpendicularly from the first transmission line section; and a sixth transmission line section extending substantially perpendicularly from the second transmission line section.

6. The wideband Doherty power amplifier according to claim 5, wherein:

the third transmission line section has a first end and a second end;

the fourth transmission line section has a first end and second end;

the first end of the third transmission line section is directly connected with the first transmission line section;

the first end of the fourth transmission line section is directly connected with the second transmission line section; and the second end of the third transmission line section and the second end of the fourth transmission line section are directly connected with each other.

7. The wideband Doherty power amplifier according to claim 5, wherein:

the fifth transmission line section has a first end and a second end;

the sixth transmission line section has a first end and second end;

the first end of the fifth transmission line section is directly connected with the first transmission line section;

the first end of the sixth transmission line section is directly connected with the second transmission line section; and the second end of the fifth transmission line section and the second end of the sixth transmission line section are directly connected with each other.

8. The wideband Doherty power amplifier according to claim 1, further comprising:

an input power splitter having an input connected with an input port of the Doherty power amplifier;

a first branching network connected between a first output of the input power slitter and the main power amplification device; and a second branching network connected between a second output of the input power slitter and the auxiliary power amplification device.

9. The wideband Doherty power amplifier according to claim 8, wherein the first branching network includes:

an offset line having a first end connected to the first output of the input power splitter;

a first input matching network having an input connected to a second end of the offset line;

a first stabilized network having an input connected to an output of the first input matching network through a third DC block, and an output connected to the input of the main power amplification device.

10. The wideband Doherty power amplifier according to claim 8, wherein the second branching network includes:

a second input matching network having an input connected to the second output of the input power splitter;

a second stabilized network having an input connected to an output of the second input matching network through a fourth DC block, and an output connected to the input of the auxiliary power amplification device.

11. The wideband Doherty power amplifier according to claim 1, further comprising a post matching network having:

an input connected to a combining node combining a main current signal from the main power amplification device and an auxiliary signal from the auxiliary power amplification device; and an output connected to the output port.

12. The wideband Doherty power amplifier according to claim 1, wherein the main power amplification device is biased to operate as a Class AB amplifier.

13. The wideband Doherty power amplifier according to claim 1, the main power amplification device comprises a transistor.

14. The wideband Doherty power amplifier according to claim 1, wherein the auxiliary power amplification device is biased to operate as a Class C amplifier.

15. The wideband Doherty power amplifier according to claim 1, the auxiliary power amplification device comprises a transistor.

16. The wideband Doherty power amplifier according to claim 1, wherein:

the main power amplification device has a main output impedance at saturation; and the auxiliary power amplification device has an auxiliary output impedance at saturation;

the main output impedance at saturation and the auxiliary output impedance at saturation are substantially identical and equal to $2R_L$, where $R_L$ is a load impedance at the output port.

17. The wideband Doherty power amplifier according to claim 1, wherein:

the main power amplification device has a main output impedance at back-off point; and the auxiliary power amplification device has an auxiliary output impedance at back-off point;

the main output impedance at back-off point is substantially equal to $R_L$, where $R_L$ is a load impedance at the output port; and the auxiliary output impedance at back-off point is substantially infinite.

18. An electronic device comprising the wideband Doherty power amplifier according to claim 1.

* * * * *